(12) United States Patent
Mitsui et al.

(10) Patent No.: US 11,366,168 B2
(45) Date of Patent: Jun. 21, 2022

(54) BATTERY INFORMATION PROCESSING SYSTEM, BATTERY INFORMATION PROCESSING METHOD, AND BATTERY ASSEMBLY AND METHOD OF MANUFACTURING BATTERY ASSEMBLY

(71) Applicant: TOYOTA JIDOSHA KABUSHIKI KAISHA, Toyota (JP)

(72) Inventors: Masahiko Mitsui, Toyota (JP); Junta Izumi, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 526 days.

(21) Appl. No.: 16/517,783

(22) Filed: Jul. 22, 2019

(65) Prior Publication Data

US 2020/0049771 A1 Feb. 13, 2020

(30) Foreign Application Priority Data

Aug. 8, 2018 (JP) .............................. JP2018-149073

(51) Int. Cl.
| | |
|---|---|
| *G01R 31/367* | (2019.01) |
| *H01M 10/34* | (2006.01) |
| *G01R 31/389* | (2019.01) |
| *H01M 10/42* | (2006.01) |
| *H01M 50/342* | (2021.01) |

(52) U.S. Cl.
CPC ......... *G01R 31/367* (2019.01); *G01R 31/389* (2019.01); *H01M 10/345* (2013.01); *H01M 10/4285* (2013.01); *H01M 50/342* (2021.01)

(58) Field of Classification Search
CPC ....... B60L 58/12; B60L 58/16; G01R 31/396; G01R 31/392; G01R 31/3842; G01R 31/389; G01R 31/387; G01R 31/367; H01M 10/42; H01M 10/425; H01M 10/4285; H01M 10/54; H01M 10/44; H01M 2220/20; H01M 2010/4271
USPC .......... 29/593; 324/400, 425, 430, 433, 431, 324/500, 600, 764.01, 103 R, 771,
(Continued)

(56) References Cited

U.S. PATENT DOCUMENTS

| | | | |
|---|---|---|---|
| 2015/0303533 A1* | 10/2015 | Osaka | G01R 31/374 429/90 |
| 2018/0143257 A1* | 5/2018 | Garcia | G01R 31/382 |

FOREIGN PATENT DOCUMENTS

JP 2014-207789 A 10/2014

* cited by examiner

*Primary Examiner* — Douglas X Rodriguez
*Assistant Examiner* — Trung Q Nguyen
(74) *Attorney, Agent, or Firm* — Sughrue Mion, PLLC

(57) ABSTRACT

An analysis device determines, by the Maharanobis-Taguchi system using a plurality of explanatory variables, to which of a first group and a second group a module representing a nickel metal hydride battery will belong when the module is subjected to capacity restoration processing, the first group being defined as a group of modules of which battery capacity is lower than a reference capacity, the second group being defined as a group of modules of which battery capacity is higher than a reference capacity. The plurality of explanatory variables include a plurality of feature values extracted from a Nyquist plot of the module. The plurality of feature values include at least two AC impedance real number components plotted in a semicircular portion, at least two AC impedance imaginary number components plotted in the semicircular portion, and at least one AC impedance imaginary number component plotted in a linear portion.

7 Claims, 12 Drawing Sheets

(58) Field of Classification Search
USPC ........ 324/761.01, 501, 639, 642, 702, 76.11,
324/76.66, 96
See application file for complete search history.

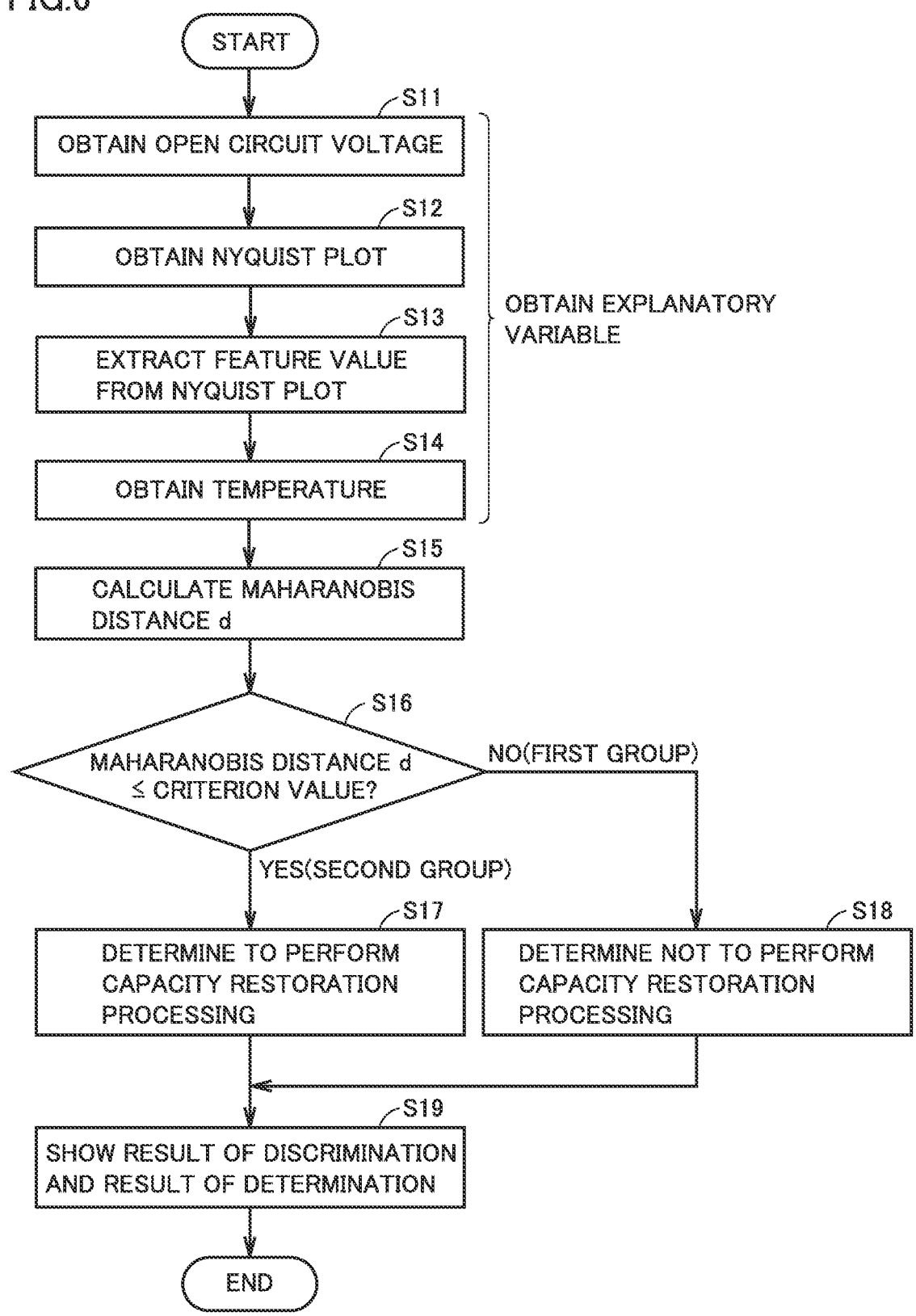

FIG.7

|   | EXPLANATORY VARIABLE | FREQUENCY | SOC |
|---|---|---|---|
| ① | AC IMPEDANCE IMAGINARY NUMBER COMPONENT | 100mHz | 0% |
| ② | AC IMPEDANCE REAL NUMBER COMPONENT | 500Hz | 20% |
| ③ | AC IMPEDANCE REAL NUMBER COMPONENT | 63Hz | 20% |
| ④ | AC IMPEDANCE REAL NUMBER COMPONENT | 10Hz | 20% |
| ⑤ | AC IMPEDANCE REAL NUMBER COMPONENT | 3.2Hz | 20% |
| ⑥ | AC IMPEDANCE IMAGINARY NUMBER COMPONENT | 63Hz | 20% |
| ⑦ | AC IMPEDANCE IMAGINARY NUMBER COMPONENT | 32Hz | 20% |
| ⑧ | AC IMPEDANCE IMAGINARY NUMBER COMPONENT | 10Hz | 20% |
| ⑨ | AC IMPEDANCE IMAGINARY NUMBER COMPONENT | 1.6Hz | 20% |
| ⑩ | AC IMPEDANCE IMAGINARY NUMBER COMPONENT | 600mHz | 20% |
| ⑪ | AC IMPEDANCE IMAGINARY NUMBER COMPONENT | 200mHz | 20% |
| ⑫ | RESPONSE VOLTAGE | 1kHz | 20% |
| ⑬ | DIFFUSION INCLINATION | – | 20% |
| ⑭ | TEMPERATURE | – | 20% |

FIG. 10

COEFFICIENT $a_i$

| i | |
|---|---|
| x1 | -4.78823 |
| x2 | -3346.45 |
| x3 | -2608.09 |
| x4 | -8200.51 |
| x5 | 18496.69 |
| x6 | -1596.68 |
| x7 | -12528.9 |
| x8 | -13589.7 |
| x9 | -25241.1 |
| x10 | 21716.8 |
| x11 | -1643.9 |
| x12 | 1194.826 |
| x13 | -11.5449 |
| x14 | 523.2841 |

COEFFICIENT $b_{ij}$

| i \ j | x1 | x2 | x3 | x4 | x5 | x6 | x7 | x8 | x9 | x10 | x11 | x12 | x13 | x14 |
|---|---|---|---|---|---|---|---|---|---|---|---|---|---|---|
| x1 | -0.0011 | 0 | 0 | 0 | 0 | 0 | 0 | 0 | 0 | 0 | 0 | 0 | 0 | 0 |
| x2 | -0.52967 | 301.4601 | 0 | 0 | 0 | 0 | 0 | 0 | 0 | 0 | 0 | 0 | 0 | 0 |
| x3 | -0.28355 | -1048.13 | 299.2947 | 0 | 0 | 0 | 0 | 0 | 0 | 0 | 0 | 0 | 0 | 0 |
| x4 | -0.47449 | -404.693 | 538.0831 | -2332.18 | 0 | 0 | 0 | 0 | 0 | 0 | 0 | 0 | 0 | 0 |
| x5 | 1.27593 | 1196.252 | -88.2129 | 5534.281 | -4088.3 | 0 | 0 | 0 | 0 | 0 | 0 | 0 | 0 | 0 |
| x6 | -0.62879 | -138.239 | -746.926 | 1740.929 | -905.753 | -118.77 | 0 | 0 | 0 | 0 | 0 | 0 | 0 | 0 |
| x7 | -0.26653 | -1092.32 | -2133.65 | -314.406 | 3981.835 | -676.112 | -3919.85 | 0 | 0 | 0 | 0 | 0 | 0 | 0 |
| x8 | -1.98254 | -1455.6 | 1104.012 | -4201.22 | 5656.959 | -738.185 | -2823.35 | -1819.46 | 0 | 0 | 0 | 0 | 0 | 0 |
| x9 | -0.56682 | -107.062 | -409.025 | -7102.41 | 9652.018 | 2525.653 | -4150.33 | -5720.16 | -7725.2 | 0 | 0 | 0 | 0 | 0 |
| x10 | 0.34754 | 165.5305 | 252.4787 | 4288.047 | -6436.4 | -2158 | 3792.469 | 3549.112 | 12707.6 | -5438.73 | 0 | 0 | 0 | 0 |
| x11 | 0.45484 | 80.39609 | 145.0603 | 373.6962 | -515.612 | 505.5009 | 95.22673 | 706.8597 | -663.562 | 583.103 | 7.05984 | 0 | 0 | 0 |
| x12 | 0.65246 | -225.592 | 471.5463 | 2671.1739 | -731.399 | 408.1962 | 325.6793 | 745.326 | 429.0158 | -781.038 | 204.2829 | 149.4597 | 0 | 0 |
| x13 | -0.00571 | 2.95317 | -8.97305 | 2.26781 | 0.60845 | -7.06586 | -0.33863 | -12.1077 | 32.11565 | -26.9228 | 6.33341 | -2.89308 | 0.07165 | 0 |
| x14 | -0.00848 | 117.6784 | -29.4078 | 2.79881 | -132.887 | -31.1556 | 295.3756 | 59.66838 | 278.7243 | -113.771 | -44.6235 | -76.8862 | 1.64237 | 3.35804 |

BATTERY INFORMATION PROCESSING SYSTEM, BATTERY INFORMATION PROCESSING METHOD, AND BATTERY ASSEMBLY AND METHOD OF MANUFACTURING BATTERY ASSEMBLY

This nonprovisional application is based on Japanese Patent Application No. 2018-149073 filed with the Japan Patent Office on Aug. 8, 2018, the entire contents of which are hereby incorporated by reference.

BACKGROUND

Field

The present disclosure relates to a battery information processing system, a battery information processing method, as well as a battery assembly and a method of manufacturing the same, and more particularly to an information processing technique about a capacity of a nickel metal hydride battery.

Description of the Background Art

More electrically powered vehicles incorporating battery assemblies such as hybrid vehicles or electric vehicles have gradually been used. Used battery assemblies are collected on the occasion of replacement purchase of these electrically powered vehicles. The number of collected battery assemblies is expected to rapidly increase in the future. In general, a battery assembly may deteriorate with lapse of time or with repeated charging and discharging, and a degree of progress of deterioration is different for each collected battery assembly. Therefore, it has been required to evaluate a degree of progress of deterioration of each of the collected battery assemblies and to recycle the battery assemblies in accordance with results of evaluation.

Deterioration of a nickel metal hydride battery such as lowering in battery capacity (a full charge capacity) due to decrease in discharged capacity of a negative electrode has been known. For example, Japanese Patent Laying-Open No. 2014-207789 discloses processing for restoring a battery capacity by increasing a discharged capacity of a negative electrode by overcharging a nickel metal hydride battery when deterioration occurs. This processing is herein also referred to as "capacity restoration processing."

SUMMARY

Overview of capacity restoration processing will be described. In general, a trace amount of hydrogen gas may leak from a nickel metal hydride battery to the outside of the battery. Accordingly, hydrogen in an amount in accordance with an amount of leakage to the outside is emitted from a hydrogen storage alloy (a negative electrode) so as to keep equilibrium of a hydrogen partial pressure in the battery. Then, the discharged capacity of the negative electrode decreases, which leads to lowering in battery capacity of the nickel metal hydride battery.

When a nickel metal hydride battery is overcharged, oxygen gas is generated at the positive electrode as a result of decomposition of an electrolyte solution, whereas hydrogen is generated at the negative electrode as a result of decomposition of water. Therefore, in order to increase again the discharged capacity of the negative electrode, an amount of hydrogen stored in the hydrogen storage alloy may be increased by overcharging the nickel metal hydride battery.

When the nickel metal hydride battery is not provided with a safety valve, hydrogen is consumed by generation of water from oxygen gas and hydrogen and an amount of hydrogen stored in the hydrogen storage alloy cannot be increased. In contrast, when the nickel metal hydride battery is provided with a safety valve, at least some of oxygen gas generated from the positive electrode is emitted to the outside of the battery through the safety valve. Then, in the battery, hydrogen is excessive over oxygen gas, and at least some of hydrogen can remain as being stored in the hydrogen storage alloy without reaction with oxygen gas. The discharged capacity of the negative electrode can thus be increased, and consequently, the battery capacity of the nickel metal hydride battery can be restored (see Japanese Patent Laying-Open No. 2014-207789 for details about capacity restoration processing).

The battery capacity of all nickel metal hydride batteries, however, cannot necessarily be restored by capacity restoration processing. Depending on a manner of deterioration of the nickel metal hydride battery (deterioration by aging), the battery capacity may not be restored in spite of capacity restoration processing. Since capacity restoration processing requires time and cost, whether or not a battery capacity is restorable by capacity restoration processing is desirably predictable prior to performing capacity restoration processing.

The present disclosure was made to solve the problems above, and an object thereof is to provide a technique for accurately predicting whether or not a battery capacity is restorable by capacity restoration processing. Another object of the present disclosure is to provide a battery assembly of which battery capacity has been restored by capacity restoration processing.

(1) A battery information processing system according to one aspect of the present disclosure processes information on a secondary battery representing a nickel metal hydride battery including a positive electrode, a negative electrode, and a safety valve. The battery information processing system includes an obtaining device configured to obtain a measurement value of an alternating-current (AC) impedance of the secondary battery for creating a Nyquist plot and an analysis device configured to determine, by a Maharanobis-Taguchi method using a plurality of explanatory variables, to which of a first group and a second group the secondary battery will belong when the secondary battery is subjected to capacity restoration processing, the first group being defined as a group of secondary batteries of which battery capacity is lower than a reference capacity, the second group being defined as a group of secondary batteries of which battery capacity is higher than the reference capacity. The plurality of explanatory variables include a plurality of feature values extracted from the Nyquist plot. The Nyquist plot includes a semicircular portion which is a semicircular track of measurement values of the AC impedance and a linear portion which is a linear track of measurement values of the AC impedance. The plurality of feature values include at least two AC impedance real number components plotted in the semicircular portion, at least two AC impedance imaginary number components plotted in the semicircular portion, and at least one AC impedance imaginary number component plotted in the linear portion.

(2) The plurality of explanatory variables further include an open circuit voltage of the secondary battery at the time of start of measurement of the AC impedance and a temperature of the secondary battery at the time of measurement of the AC impedance. The plurality of feature values further include a slope of the linear portion.

(3) The Nyquist plot includes the measurement value of the AC impedance when a frequency of an AC signal applied to the secondary battery is within a frequency range not lower than 100 mHz and not higher than 1 kHz. The at least two AC impedance real number components include a real number component of the measurement value of the AC impedance when the frequency of the AC signal is set to 500 Hz, 63 Hz, 10 Hz, and 3.2 Hz. The at least two AC impedance imaginary number components include an imaginary number component of the measurement value of the AC impedance when the frequency of the AC signal is set to 63 Hz, 32 Hz, 10 Hz, and 1.6 Hz. The at least one AC impedance imaginary number component includes an imaginary number component of the measurement value of the AC impedance when the frequency of the AC signal is set to 600 mHz, 200 mHz, and 100 mHz.

(4) The capacity restoration processing refers to processing for increasing a discharged capacity of the negative electrode by generating oxygen gas from the positive electrode by charging the secondary battery and emitting at least some of the generated oxygen gas to the outside of the secondary battery through the safety valve.

According to the features in (1) to (4), as a result of dedicated studies conducted by the present inventors, a plurality of explanatory variables found suitable for discriminant analysis are used. By using these explanatory variables, a module of which battery capacity is predicted to be lower than a reference capacity when it is subjected to capacity restoration processing can highly accurately be determined as belonging to the first group, and a module of which battery capacity is predicted to be higher than the reference capacity when it is subjected to capacity restoration processing can highly accurately be determined as belonging to the second group. According to the features in (1) to (4), whether or not a battery capacity of a secondary battery to be analyzed is restorable by capacity restoration processing can accurately be predicted.

(5) A battery assembly according to another aspect of the present disclosure includes a plurality of the secondary batteries determined as belonging to the second group by the battery information processing system and subjected to the capacity restoration processing.

According to the feature in (5), a battery assembly is constructed from a plurality of secondary batteries of which battery capacity has been predicted to be restorable by capacity restoration processing. Therefore, a battery assembly high in battery capacity can be provided.

(6) A battery information processing method according to yet another aspect of the present disclosure processes information on a secondary battery representing a nickel metal hydride battery including a positive electrode, a negative electrode, and a safety valve. The battery information processing method includes obtaining a measurement value of an AC impedance of the secondary battery for creating a Nyquist plot and determining, by a Maharanobis-Taguchi method using a plurality of explanatory variables, to which of a first group and a second group the secondary battery will belong when the secondary battery is subjected to capacity restoration processing, the first group being defined as a group of secondary batteries of which battery capacity is lower than a reference capacity, the second group being defined as a group of secondary batteries of which battery capacity is higher than the reference capacity. The plurality of explanatory variables include a plurality of feature values extracted from the Nyquist plot. The Nyquist plot includes a semicircular portion which is a semicircular track of measurement values of the AC impedance and a linear portion which is a linear track of measurement values of the AC impedance. The plurality of feature values include at least two AC impedance real number components plotted in the semicircular portion, at least two AC impedance imaginary number components plotted in the semicircular portion, and at least one AC impedance imaginary number component plotted in the linear portion.

According to the method in (6), as in the features in (1), whether or not a battery capacity is restorable by capacity restoration processing can accurately be predicted.

(7) A method of manufacturing a battery assembly according to still another aspect of the present disclosure includes collecting a plurality of the secondary batteries determined as belonging to the second group by the battery information processing method and subjecting each of the secondary batteries to the capacity restoration processing and constructing a battery assembly from a plurality of the secondary batteries subjected to the capacity restoration processing.

According to the method in (7), as in the feature in (5), a battery assembly high in battery capacity can be provided.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 6 is a flowchart relating to discriminant analysis in the present embodiment.

FIG. 7 is a diagram for illustrating an explanatory variable used in discriminant analysis.

FIG. 10 is a diagram showing one example of a coefficient.

DESCRIPTION OF THE PREFERRED EMBODIMENTS

Figure 1:
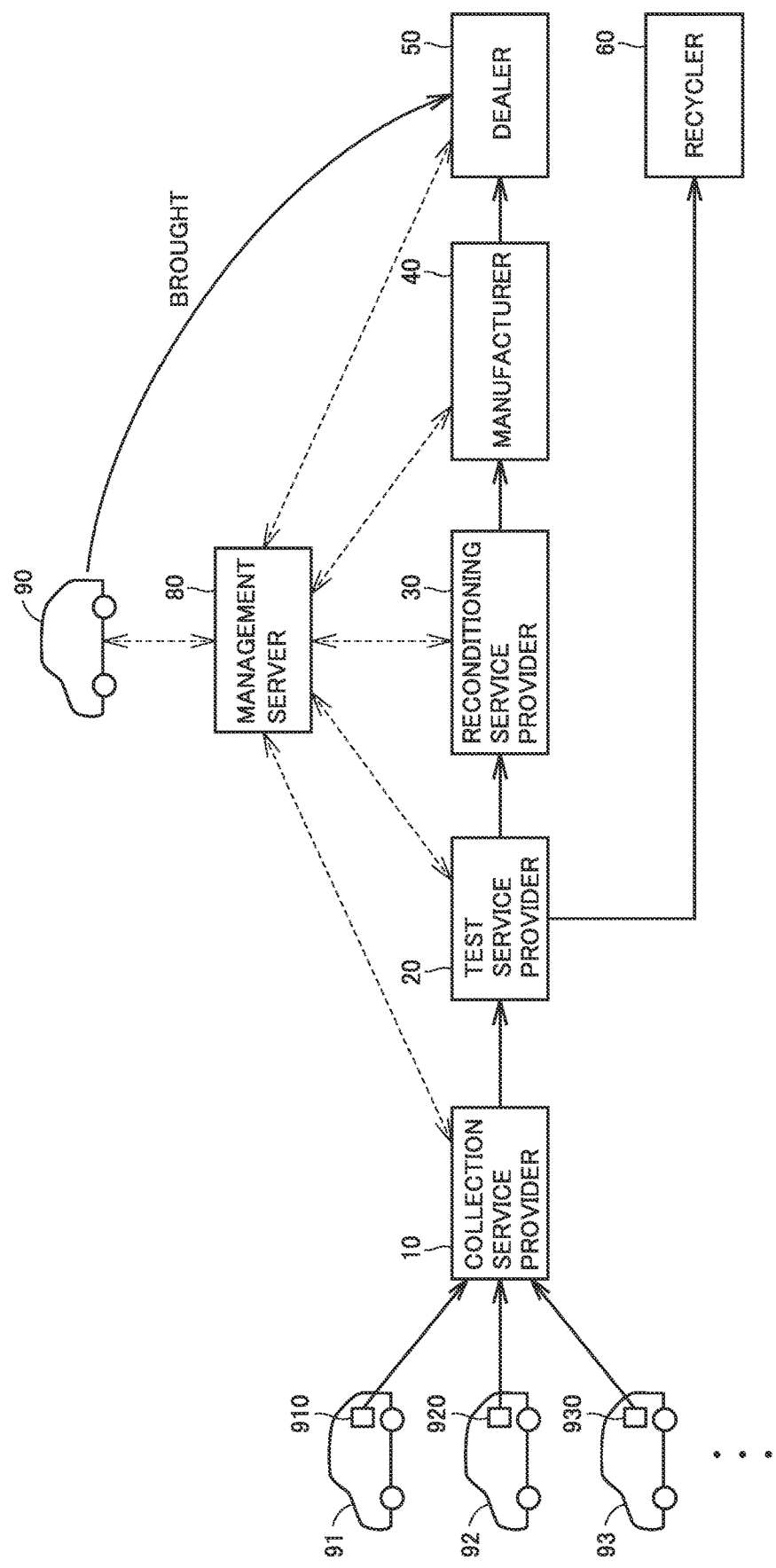
FIG. 1 is a diagram showing one manner of distribution from collection to manufacturing and sales of battery assemblies in the present embodiment.

An embodiment of the present disclosure will be described below in detail with reference to the drawings.

The same or corresponding elements in the drawings have the same reference characters allotted and description thereof will not be repeated.

In the present disclosure, a battery assembly includes a plurality of modules. The plurality of modules may be connected in series or in parallel. Each of the plurality of modules includes a plurality of cells (unit cells) connected in series.

"Manufacturing" of a battery assembly in the present disclosure means manufacturing of a battery assembly by replacing at least one of a plurality of modules included in a battery assembly with other modules (replacement modules). Though the replacement module is basically a recyclable module taken out of a collected battery assembly, it may be a new module.

In general, "recycle" of a battery assembly is broadly categorized into reuse, rebuild, and resource recycle. In the case of reuse, collected battery assemblies are subjected to necessary shipment inspection and shipped as they are as reuse products. In the case of rebuild, collected battery assemblies are once disassembled, for example, to modules (which may be cells). Then, among the disassembled modules, modules which can be used after reconditioning (which may be modules which can be used as they are) are combined to manufacture a new battery assembly. Newly manufactured battery assemblies are subjected to shipment inspection and shipped as rebuilt products. In resource recycle, renewable materials (resources) are taken out of each cell and hence collected battery assemblies are not used as other battery assemblies.

In the embodiment described below, a battery assembly collected from a vehicle is once disassembled into modules and a performance test is conducted for each module. A battery assembly is manufactured from modules determined as being recyclable as a result of the performance test. Therefore, a recyclable module means a rebuildable module below. Depending on a configuration of a battery assembly, however, a battery assembly as it is can also be subjected to the performance test without being disassembled into modules. "Recycle" in such a case may encompass both of reuse and rebuild.

In the present embodiment, each cell is implemented by a nickel metal hydride battery. More specifically, a positive electrode is composed of nickel hydroxide ($Ni(OH)_2$) to which a cobalt oxide additive is added. A negative electrode is composed of a hydrogen storage alloy (based on MnNi5 which represents a nickel-based alloy). An electrolyte solution is composed of potassium hydroxide (KOH). A battery case of the nickel metal hydride battery is provided with a safety valve. These, however, are merely by way of example of a specific cell configuration, and a cell configuration to which the present disclosure is applicable is not limited thereto.

Embodiment

<Battery Distribution Model>

Figure 2:
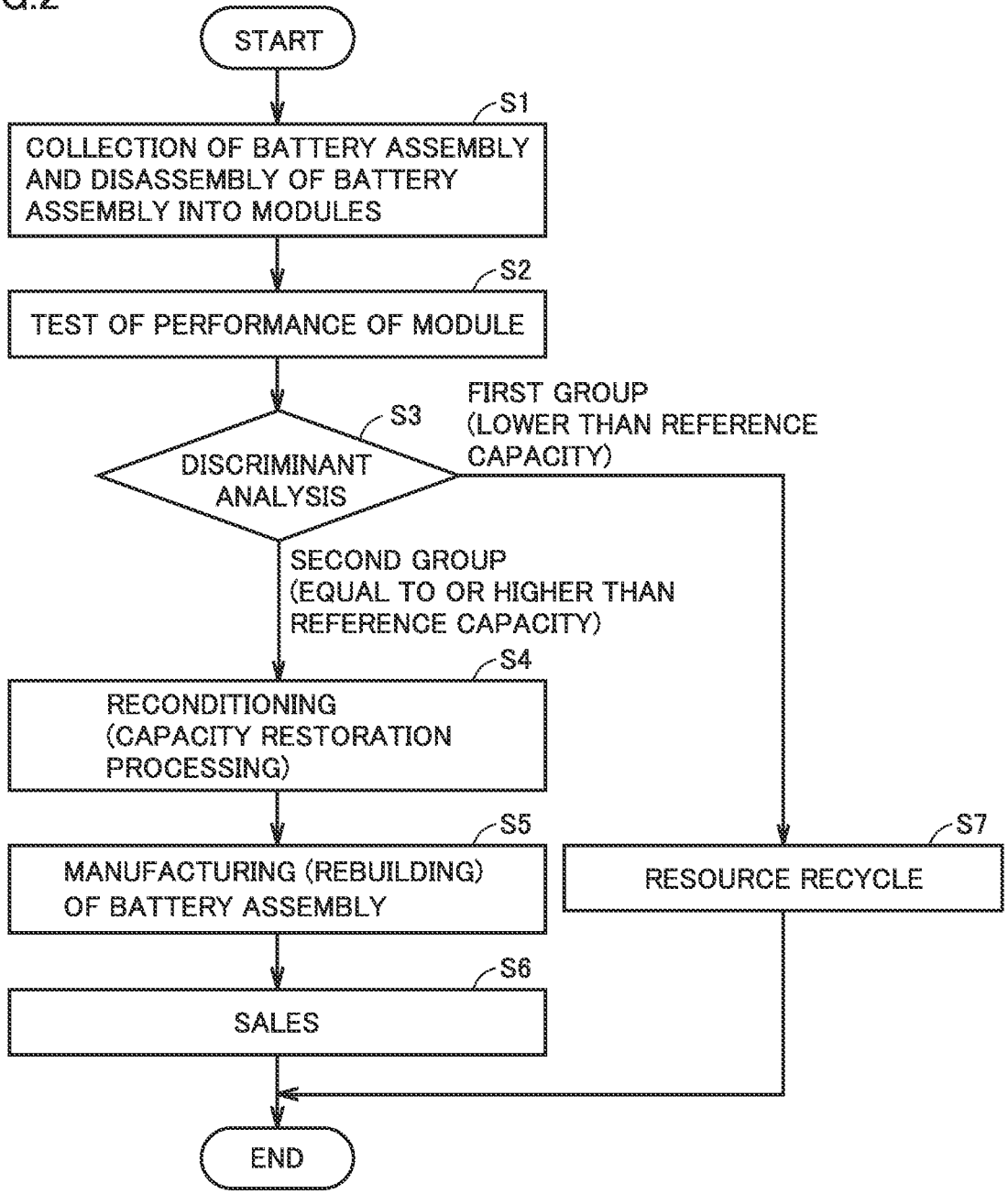
FIG. 2 is a flowchart showing a flow of processing in a battery distribution model shown in FIG. 1.

FIG. 1 is a diagram showing one manner of distribution from collection to manufacturing and sales of battery assemblies in the present embodiment. A manner of distribution shown in FIG. 1 is referred to as a "battery distribution model" below. FIG. 2 is a flowchart showing a flow of processing in the battery distribution model shown in FIG. 1.

Referring to FIGS. 1 and 2, in the battery distribution model, used battery assemblies are collected from a plurality of vehicles, and battery assemblies are manufactured from recyclable modules included in the collected battery assemblies and then sold. A battery assembly mounted on a vehicle 90 of a certain user is replaced.

A collection service provider 10 collects used battery assemblies from vehicles 91 to 93. Battery assemblies 910 to 930 are mounted on vehicles 91 to 93, respectively. Though FIG. 1 shows only three vehicles due to space restriction, battery assemblies are actually collected from a larger number of vehicles. Collection service provider 10 disassembles the collected battery assemblies and takes out a plurality of modules from the battery assemblies (step S1, hereinafter the step being abbreviated as "S").

In this battery distribution model, identification information (ID) for identifying a module is provided for each module, and a management server 80 manages information on each module. Therefore, collection service provider 10 transmits an ID of each module taken out of a battery assembly to management server 80 through a terminal device 71 (see FIG. 3).

A test service provider 20 tests performance of each module collected by collection service provider 10 (S2). Specifically, test service provider 20 tests such electrical characteristics as a battery capacity (a full charge capacity), an internal resistance, an open circuit voltage (OCV), and a state of charge (SOC) of the collected module. In addition, test service provider 20 also conducts discriminant analysis for predicting whether or not a battery capacity of a collected module is restorable when the module is subjected to capacity restoration processing which will be described later. Then, test service provider 20 classifies the modules into recyclable modules (modules of which battery capacity is restorable) (second group in S3) and non-recyclable modules (modules of which battery capacity is unrestorable or modules low in effect of restoration) (first group in S3) based on a result of discriminant analysis. Test service provider 20 passes the recyclable modules to a reconditioning service provider 30 and the non-recyclable modules to a recycler 60. A test result (including a result of discriminant analysis) of each module is transmitted to management server 80 through a terminal device 72 (see FIG. 3) of test service provider 20.

Reconditioning service provider 30 performs a process for reconditioning the module determined as recyclable by test service provider 20 (S4). Specifically, reconditioning service provider 30 restores a battery capacity of the module by charging the module to an overcharged state (capacity restoration processing). For a module determined as less in lowering in performance in the test by test service provider 20, capacity restoration processing by reconditioning service provider 30 may be skipped. A result of reconditioning of each module is transmitted to management server 80 through a terminal device 73 (see FIG. 3) of reconditioning service provider 30.

A manufacturer 40 manufactures a battery assembly from modules reconditioned by reconditioning service provider 30 (S5). In the present embodiment, information (assembly information) for manufacturing a battery assembly is generated by management server 80 and transmitted to a terminal device 74 (see FIG. 3) of manufacturer 40. Manufacturer 40 manufactures (rebuilds) a battery assembly of vehicle 90 by replacing a module included in the battery assembly of vehicle 90 in accordance with the assembly information.

A dealer 50 sells the battery assembly manufactured by manufacturer 40 for vehicle use or for stationary use in a house or the like (S6). In the present embodiment, vehicle 90 is brought to dealer 50 and dealer 50 replaces the battery assembly of vehicle 90 with a reuse product or a rebuilt product manufactured by manufacturer 40.

Recycler 60 disassembles modules determined as being non-recyclable by test service provider 20 for resource-recycle (reclamation) for use as new cells or as source materials for other products (S7).

Though collection service provider 10, test service provider 20, reconditioning service provider 30, manufacturer 40, and dealer 50 are service providers different from one another in FIG. 1, classification of the service providers is not limited as such. For example, a single service provider may serve as test service provider 20 and reconditioning service provider 30. Alternatively, collection service provider 10 may be divided into a service provider which collects battery assemblies and a service provider which disassembles collected battery assemblies. Locations of each service provider and each dealer are not particularly limited. Locations of each service provider and each dealer may be different or a plurality of service providers or dealers may be located at the same place.

Figure 3:
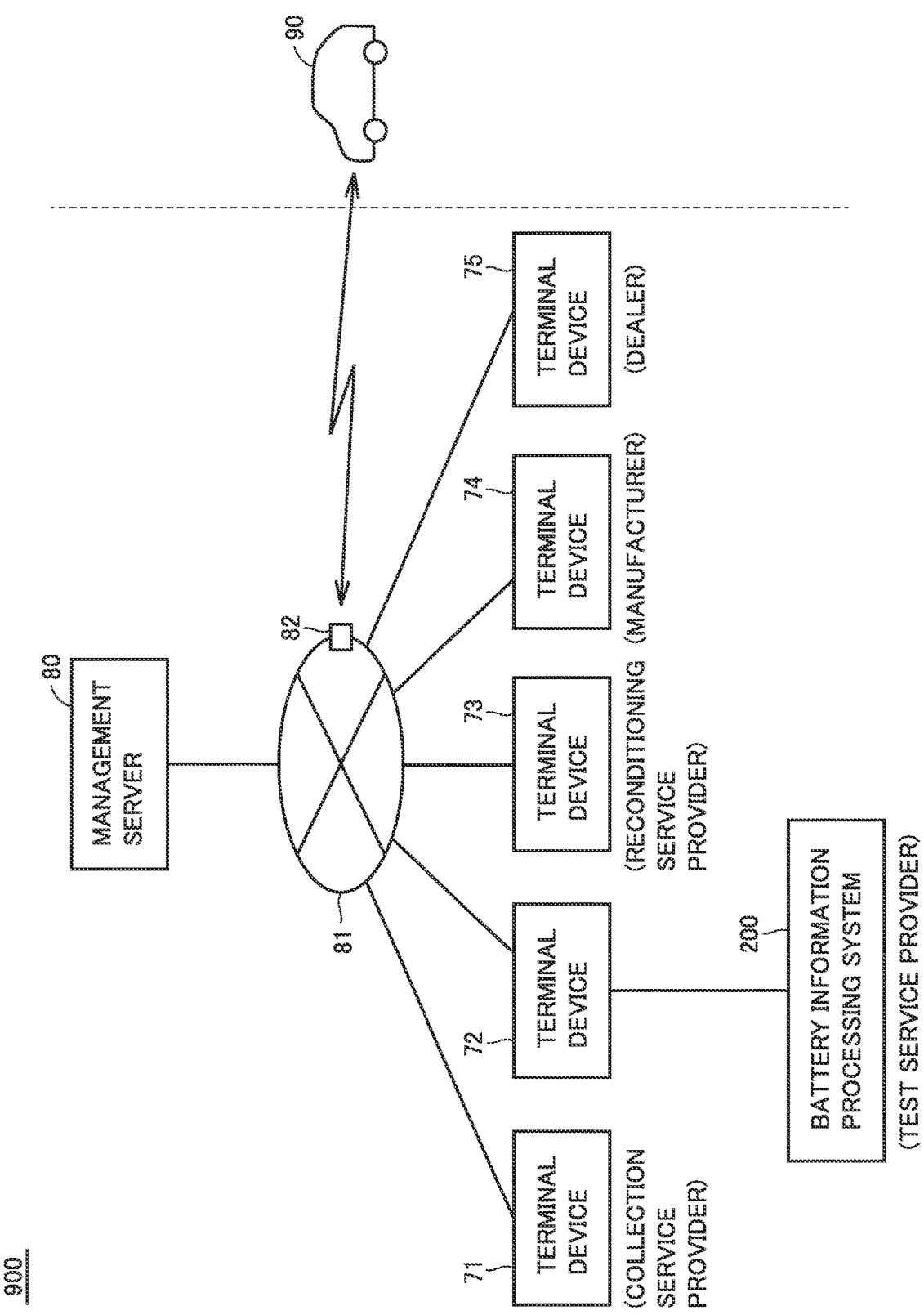
FIG. 3 is a diagram showing an exemplary configuration of a battery management system applied to the battery distribution model shown in FIG. 1.

FIG. 3 is a diagram showing an exemplary configuration of a battery management system applied to the battery distribution model shown in FIG. 1. Referring to FIG. 3, a battery management system 100 includes terminal devices 71 to 75, management server 80, a communication network 81, and a base station 82.

Terminal device 71 is a terminal device of collection service provider 10. Terminal device 72 is a terminal device of test service provider 20. Terminal device 73 is a terminal device of reconditioning service provider 30. Terminal device 74 is a terminal device of manufacturer 40. Terminal device 75 is a terminal device of dealer 50.

Management server 80 and terminal devices 71 to 75 are configured to communicate with one another through communication network 81 such as the Internet or telephone lines. Base station 82 on communication network 81 is configured to be able to transmit and receive information to and from vehicle 90 through wireless communication.

In test service provider 20, a battery information system (which may be abbreviated as a "processing system" below) 200 for measuring an AC impedance of each module and determining a manner of recycle (rebuild or resource recycle) of the module based on a result of measurement is provided. The manner of recycle of the module determined by processing system 200 is transmitted to management server 80, for example, through terminal device 72.

Whether to perform capacity restoration processing onto a certain module (which is denoted as a "module M") among a plurality of modules included in battery assembly 910 taken out of vehicle 91 is determined by processing system 200 below.

<Capacity Restoration Processing>

Overview of capacity restoration processing will next be described. In general, a trace amount of hydrogen gas may leak from a nickel metal hydride battery to the outside of the battery. Accordingly, hydrogen in an amount in accordance with an amount of leakage to the outside is emitted from a hydrogen storage alloy (negative electrode) so as to keep equilibrium of a hydrogen partial pressure in the battery. A discharged capacity of the negative electrode thus decreases, which leads to lowering in battery capacity of the nickel metal hydride battery.

When a nickel metal hydride battery is overcharged, oxygen gas is generated at a positive electrode as a result of decomposition of an electrolyte solution, whereas hydrogen is generated at the negative electrode as a result of decomposition of water. Therefore, in order to increase again the discharged capacity of the negative electrode, an amount of hydrogen stored in the hydrogen storage alloy may be increased by overcharging the nickel metal hydride battery.

When the nickel metal hydride battery is not provided with a safety valve, hydrogen is consumed by generation of water from oxygen gas and hydrogen and an amount of hydrogen stored in the hydrogen storage alloy cannot be increased. In contrast, when the nickel metal hydride battery is provided with a safety valve, at least some of oxygen gas generated from the positive electrode is emitted to the outside of the battery through the safety valve. Then, in the battery, hydrogen is excessive over oxygen gas, and at least some of hydrogen can remain as being stored in the hydrogen storage alloy without reaction with oxygen gas. The discharged capacity of the negative electrode can thus be increased, and consequently, the battery capacity of the nickel metal hydride battery can be restored (see Japanese Patent Laying-Open No. 2014-207789 for details about capacity restoration processing).

<System Configuration>

Figure 4:
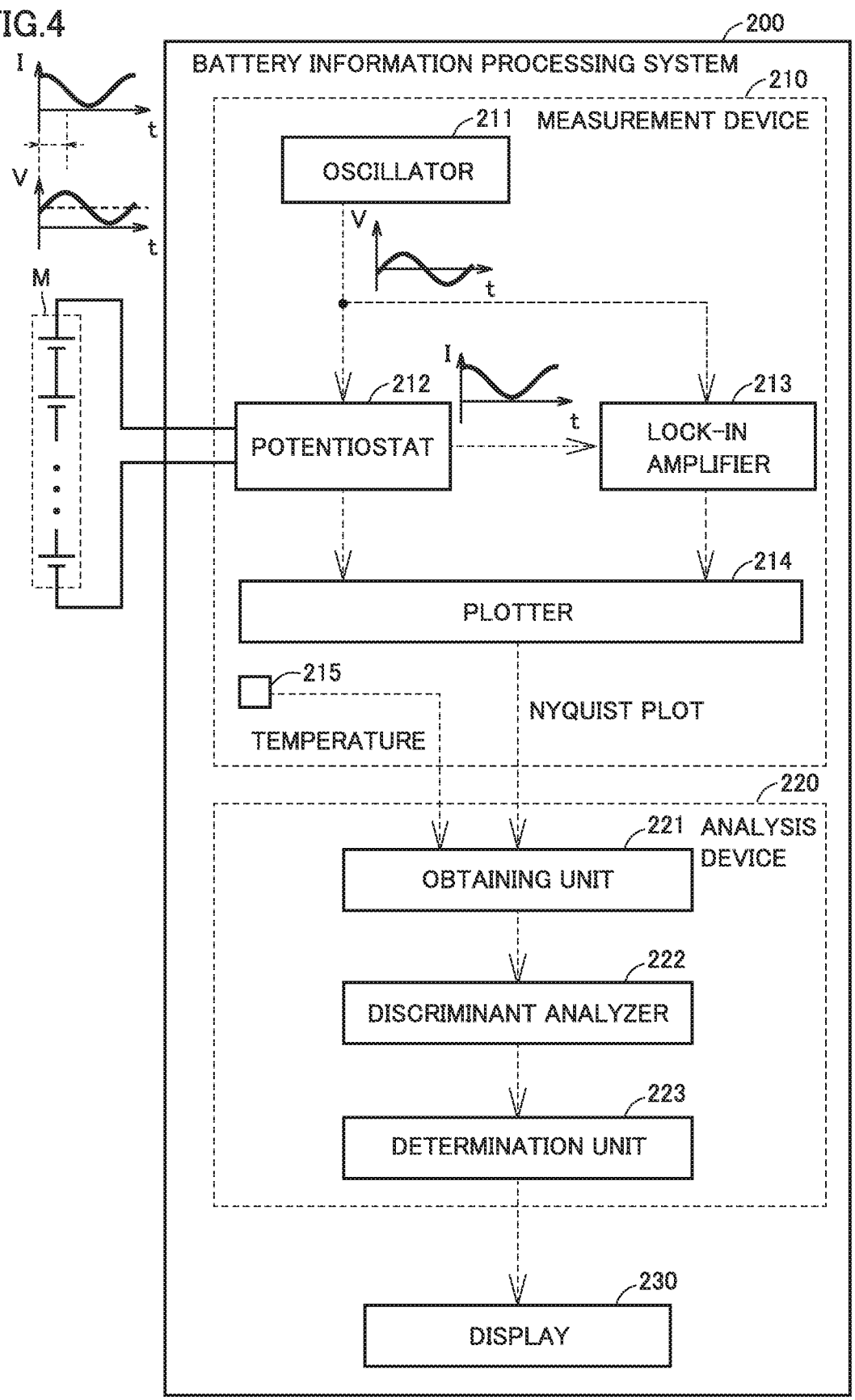
FIG. 4 is a diagram showing a configuration of a battery information system.

FIG. 4 is a diagram showing a configuration of a battery information processing system (processing system) 200. Processing system 200 includes a measurement device 210, an analysis device 220, and a display 230. These devices may be configured as devices independent of one another or as a single device.

Measurement device 210 measures an AC impedance of module M and outputs a Nyquist plot representing a result of measurement to analysis device 220. More specifically, measurement device 210 includes an oscillator 211, a potentiostat 212, a lock-in amplifier 213, and a plotter 214. Measurement device 210 includes a temperature sensor 215 configured to measure a temperature of module M.

Oscillator 211 outputs sinusoidal waves identical in phase to potentiostat 212 and lock-in amplifier 213.

Potentiostat 212 generates an application signal by superimposing a prescribed direct-current (DC) voltage on an AC voltage (for example, a voltage at an amplitude around 10 mV) identical in phase to sinusoidal waves from oscillator 211 and applies the generated application signal to module M. Then, potentiostat 212 detects a current which flows through module M and outputs a result of detection to lock-in amplifier 213 as a response signal from module M. Potentiostat 212 outputs the application signal and the response signal to plotter 214.

Lock-in amplifier 213 compares a phase of the sinusoidal waves received from oscillator 211 with a phase of the response signal detected by potentiostat 212 and outputs a result of comparison (a phase difference between the sinusoidal waves and the response signal) to plotter 214.

Plotter 214 plots a result of measurement of an AC impedance of module M on a complex plane based on a signal from potentiostat 212 (a signal indicating an amplitude ratio between the application signal and the response signal) and a signal from lock-in amplifier 213 (a signal indicating a phase difference between the application signal and the response signal). More specifically, a frequency of sinusoidal waves output from oscillator 211 is swept in a prescribed frequency range and processing described previously is repeatedly performed by potentiostat 212 and lock-in amplifier 213. Thus, results of measurement of an AC impedance of module M for each frequency of sinusoidal waves are plotted on the complex plane. This plot is called a "Nyquist plot" (which may also be called a Cole-Cole plot). The Nyquist plot of module M is output to analysis device 220.

The configuration of measurement device 210 is not limited to the configuration shown in FIG. 4. For example, though description that an AC voltage is applied to module M and a current which flows through module M at that time is detected has been given, potentiostat 212 may detect a voltage response at the time of application of an AC current to module M. Measurement device 210 may include a frequency response analyzer (not shown) instead of lock-in amplifier 213.

An approach below can also be adopted as an approach to measurement of an AC impedance. Specifically, an application signal (one of a voltage signal and a current signal) including various frequency components within a prescribed frequency range is generated, and a response signal (the other of the voltage signal and the current signal) at the time of application of the application signal is detected. Each of the application signal and the response signal is subjected to fast Fourier transform (FFT) for frequency decomposition, to thereby calculate an AC impedance for each frequency. A Nyquist plot can be created also by such an approach.

Analysis device 220 is implemented, for example, by a microcomputer including a central processing unit (CPU), a memory, and an input/output port (none of which is shown). Specifically, analysis device 220 includes an obtaining unit 221, a discriminant analyzer 222, and a determination unit 223.

Obtaining unit 221 obtains a Nyquist plot created from a result of measurement of an AC impedance of module M by measurement device 210 and outputs the Nyquist plot to discriminant analyzer 222. Obtaining unit 221 corresponds to the "obtaining device" according to the present embodiment.

Discriminant analyzer 222 classifies module M into any of the first group and the second group by conducting discriminant analysis based on the Nyquist plot of module M. The second group refers to a group of modules of which battery capacity is predicted to be not lower than a prescribed reference capacity (for example, 5.6 Ah) when they are subjected to capacity restoration processing. The first group refers to a group of modules of which battery capacity is predicted to be lower than the reference capacity even though they are subjected to capacity restoration processing. Discriminant analysis by discriminant analyzer 222 will be described in detail later. Discriminant analyzer 222 corresponds to the "analysis device" according to the present disclosure.

Determination unit 223 determines whether or not capacity restoration processing onto module M is required in accordance with a result of discriminant analysis of module M. A result of analysis by discriminant analyzer 222 and a result of determination by determination unit 223 are output to display 230.

Display 230 is implemented, for example, by a liquid crystal display and shows a result of analysis by discriminant analyzer 222 and a result of determination by determination unit 223. The test service provider can thus know how module M should be processed.

<Nyquist Plot>

Figure 5:
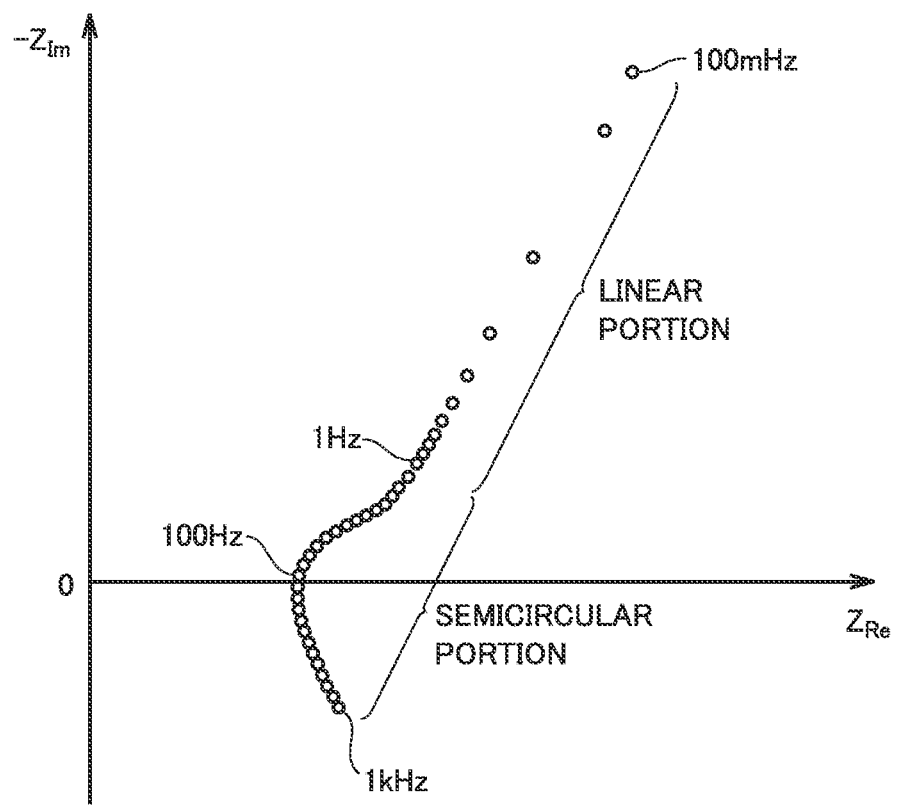
FIG. 5 is a diagram showing one example of a Nyquist plot representing a result of measurement of an AC impedance of a module.
Figure 8:
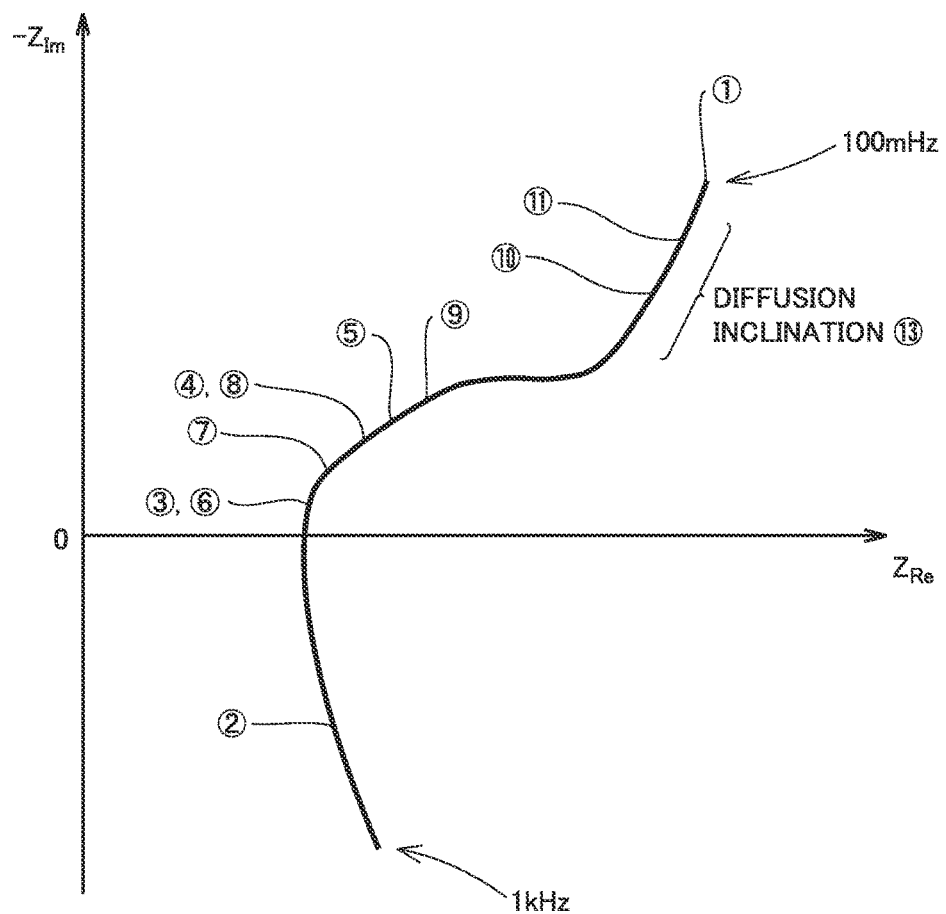
FIG. 8 is a diagram for illustrating a feature value extracted from a Nyquist plot.

FIG. 5 is a diagram showing one example of a Nyquist plot representing a result of measurement of an AC impedance of module M. In FIG. 5 and FIG. 8 which will be described later, the abscissa represents a real number component $Z_{Rc}$ of a complex impedance of module M and the ordinate represents an imaginary number component $-Z_{Im}$ of the complex impedance of module M.

FIG. 5 shows one example of a result of measurement of an AC impedance when a frequency of an application signal is swept within a range from 100 mHz to 1 kHz. As shown in FIG. 5, as a result of application of signals at various frequencies, results of measurement of the AC impedance of module M in accordance with the frequencies are plotted on the complex plane as discrete values. Specifically, in the present embodiment, application signals at 52 frequencies in a frequency region from 100 mHz to 1 kHz are employed. The frequencies of the application signals are successively swept from a high frequency (1 kHz) toward a low frequency (100 mHz).

The Nyquist plot thus created includes a semicircular portion which is a semicircular track of measurement values of the AC impedance resulting from application signals on a high frequency side (1 Hz to 1 kHz in this example) and a linear portion which is a linear track of measurement values of the AC impedance resulting from application signals on a low frequency side (100 mHz to 1 Hz).

<Discriminant Analysis Flow>

FIG. 6 is a flowchart relating to discriminant analysis in the present embodiment. This flowchart is executed by processing system 200, for example, when the test service provider sets module M in processing system 200 and operates a not-shown operation portion (such as a start button). For the sake of brevity of description, components (such as each constituent element included in measurement device 220) of processing system 200 as an entity to perform each type of processing are not particularly distinguished below and they are comprehensively denoted as "processing system 200." Though each step is basically performed by software processing by processing system 200, it may partly or entirely be performed by hardware (an electric circuit) provided in processing system 200.

Referring to FIG. 6, in S11 to S14, processing system 200 performs a series of processing for obtaining a plurality of explanatory variables used for discriminant analysis.

Specifically, initially, processing system 200 obtains a voltage (that is, an open circuit voltage (OCV)) of module M before initial application of an application signal at 1 kHz to module M (S11).

Processing system 200 measures an AC impedance of module M and obtains a Nyquist plot from a result of measurement (S12). Since the approach to measurement of an AC impedance has been described in detail in description of the configuration of measurement device 210 with reference to FIG. 4, description will not be repeated. Then, processing system 200 extracts a plurality of feature values from the Nyquist plot of module M (S13).

Processing system 200 obtains a temperature (for example, an average temperature) of module M at the time of measurement of the AC impedance of module M from temperature sensor 215 (S14).

<Explanatory Variable>

FIG. 7 is a diagram for illustrating an explanatory variable used in discriminant analysis. FIG. 8 is a diagram for illustrating a feature value extracted from a Nyquist plot. Referring to FIGS. 7 and 8, as a result of dedicated studies conducted by the present inventors, fourteen explanatory variables are used in discriminant analysis in the present embodiment. The fourteen explanatory variables include twelve feature values extracted from a Nyquist plot and two separately obtained variables.

The twelve feature values are broadly categorized into four AC impedance real number components ((2) to (5) below) plotted in the semicircular portion of the Nyquist plot, four AC impedance imaginary number components ((6) to (9) below) plotted in the semicircular portion, three AC impedance imaginary number components ((1), (10), and

(11) below) plotted in a linear portion, and an inclination of the linear portion ((13) below). More specifically, the twelve feature values are described as below.

(1) An AC impedance imaginary number component ($x_1$ in an expression (1) which will be described later) obtained in an example in which an application signal is at 100 mHz and an SOC of module M is at 0%

(2) An AC impedance real number component ($x_2$) obtained in an example in which an application signal is at 500 Hz and an SOC of module M is at 20%

(3) An AC impedance real number component ($x_3$) obtained in an example in which an application signal is at 63 Hz and an SOC of module M is at 20%

(4) An AC impedance real number component ($x_4$) obtained in an example in which an application signal is at 10 Hz and an SOC of module M is at 20%

(5) An AC impedance real number component ($x_5$) obtained in an example in which an application signal is at 3.2 Hz and an SOC of module M is at 20%

(6) An AC impedance imaginary number component ($x_6$) obtained in an example in which an application signal is at 63 Hz and an SOC of module M is at 20%

(7) An AC impedance imaginary number component ($x_7$) obtained in an example in which an application signal is at 32 Hz and an SOC of module M is at 20%

(8) An AC impedance imaginary number component ($x_8$) obtained in an example in which an application signal is at 10 Hz and an SOC of module M is at 20%

(9) An AC impedance imaginary number component ($x_9$) obtained in an example in which an application signal is at 1.6 Hz and an SOC of module M is at 20%

(10) An AC impedance imaginary number component ($x_{10}$) obtained in an example in which an application signal is at 600 mHz and an SOC of module M is at 20%

(11) An AC impedance imaginary number component ($x_{11}$) obtained in an example in which an application signal is at 200 mHz and an SOC of module M is at 20%

(13) Inclination (diffusion inclination) ($x_{13}$) of the linear portion

The two separately obtained explanatory variables relate to a condition for measuring the AC impedance of module M and they are specifically (12) and (14) below.

(12) An open circuit voltage ($x_{12}$) of module M obtained in processing in S11

(14) A temperature ($x_{14}$) of module M obtained in processing in S14

<Maharanobis-Taguchi System>

In the present embodiment, the Maharanobis-Taguchi system (MT system) is used as an approach to discriminant analysis. Though fourteen axes are required when fourteen explanatory variables are used in the Maharanobis-Taguchi system, illustration thereof cannot be provided. Therefore, illustration is simplified to an example where two explanatory variables are used.

Figure 9:
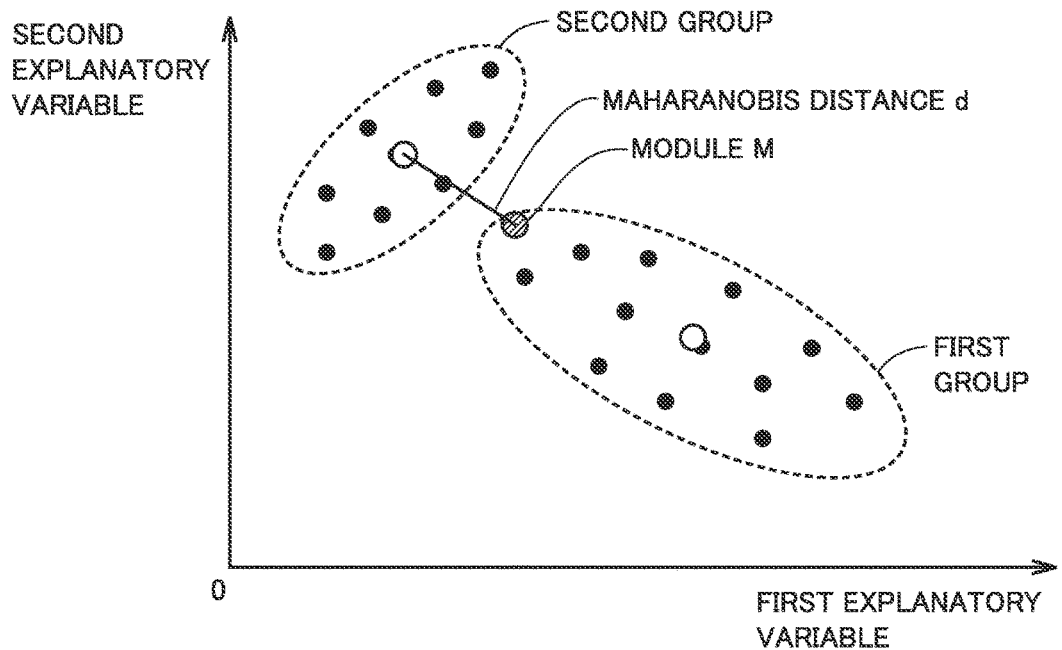
FIG. 9 is a conceptual diagram for illustrating the Maharanobis-Taguchi system.

FIG. 9 is a conceptual diagram for illustrating the Maharanobis-Taguchi system. In FIG. 9, the abscissa represents a first explanatory variable and the ordinate represents a second explanatory variable. The first explanatory variable refers to any explanatory variable among the fourteen explanatory variables. The second explanatory variable refers to any explanatory variable different from the first explanatory variable among the fourteen explanatory variables.

In this example, for each of a large number of (several ten as in an example which will be described later) modules, fourteen explanatory variables obtained by measurement of the AC impedance (Nyquist plot) and actually measured values of a battery capacity after capacity restoration processing are prepared. FIG. 9 shows plotted results of measurement of first and second explanatory variables for each module (see black circles). These plots are discriminated based on whether or not the battery capacity of the module is equal to or higher than the reference capacity. A plot group representing modules of which battery capacity is lower than the reference capacity is shown as the "first group" and a plot group representing modules of which battery capacity is equal to or higher than the reference capacity is shown as the "second group."

In determining to which of the first group and the second group module M subjected to discriminant analysis will belong (whether or not the battery capacity of module M will be equal to or higher than the reference capacity when module M is subjected to capacity restoration processing), a "Maharanobis distance d" of module M is calculated by using the first and second explanatory variables obtained from module M (S15 in FIG. 6).

Maharanobis distance d in this example where two explanatory variables are used conceptually refers to a distance between a plot representing module M and the plot group representing the second group (plots around the center in an example which even takes into consideration how plots are scattered). In FIG. 9, Maharanobis distance d is expressed as a distance between a plot representing module M (see a hatched point) and a plot (see a white circle) located in the inside of the plot group representing the second group.

An example in which the fourteen explanatory variable are used will now be described. Maharanobis distance d in this example is calculated in accordance with an expression (1) below, with n being defined as 14.

$$d = \sum_{i=1}^{n} a_i x_i + \sum_{i,j=1}^{n} b_{ij} x_i x_j + c \quad (1)$$

In the expression (1), the fourteen explanatory variables are expressed by $x_i$ (i=1 to 14) or $x_j$ (j=1 to 14). A coefficient of the explanatory variable is expressed by $a_i$ and $b_{ij}$ and a constant term is expressed by c. These coefficients $a_i$ and $b_{ij}$ and constant c are calculated, for example, as below by multivariate analysis (training) of data obtained from a large number of (for example, several ten) modules.

FIG. 10 is a diagram showing examples of coefficients $a_i$ and $b_{ij}$. By substituting coefficients $a_i$ and $b_{ij}$ and constant c (c=−24286.5 in this example) as shown in FIG. 10 into the expression (1), Maharanobis distance d of module M can be calculated from the fourteen explanatory variables of module M.

All of the fourteen explanatory variables, however, are not equally important. It has been found as a result of studies conducted by the present inventors that, in particular, five explanatory variables among the fourteen explanatory variables greatly affect results of discriminant analysis (in other words, results of discriminant analysis are highly sensitive to the five explanatory variables), and hence they are high in importance. The five variables are (5) $x_5$, (9) $x_9$, (10) $x_{10}$, (4) $x_4$, and (8) $x_8$ in the descending order of importance.

Specifically, magnitude of influence by each explanatory variable can be expressed by a sum of absolute values of coefficients of the explanatory variable. For example, a sum ($|a_5|+|b_{51}|+|b_{52}|+ \ldots +|b_{514}|$) of absolute values of $a_5$ and $b_{5j}$ (j=1 to 14) representing coefficients of explanatory variable $x_5$ is 467.17. By similarly calculating a sum of absolute values of coefficients of explanatory variable $x_9$, it is calculated as 368.12. A sum of absolute values of coefficients of explanatory variable $x_{10}$ is calculated as 305.80. A sum of absolute values of coefficients of explanatory variable $x_4$ is calculated as 224.16. A sum of absolute values of coefficients of explanatory variable $x_8$ is calculated as 215.58.

The approach to discriminant analysis by the Maharanobis-Taguchi system is not limited to such a system. For example, a Maharanobis distance between module M and the first group and a Maharanobis distance between module M and the second group may separately be calculated. Since to which of the first group and the second group module M is closer can be known by comparing the Maharanobis distances with each other, module M can be categorized into a group to which module M is relatively closer.

Referring back to FIG. 6, in S16, processing system 200 compares Maharanobis distance d calculated in S15 with a predetermined threshold value TH. When Maharanobis distance d is equal to or smaller than threshold value TH (YES in S16), processing system 200 determines module M as belonging to the second group. Therefore, processing system 200 determines that module M is to be subjected to capacity restoration processing (S17). When Maharanobis distance d is greater than threshold value TH (NO in S16), processing system 200 determines module M as belonging to the first group. In this case, processing system 200 determines that module M is not to be subjected to capacity restoration processing (S18).

Thereafter, processing system 200 has display 230 show a result of discrimination as to the group to which module M will belong (any of the first group and the second group) and a result of determination as to whether or not to perform capacity restoration processing onto module M (S19). A series of processing shown in FIG. 6 thus ends.

<Result of Evaluation of Accuracy>

Though a result of evaluation in an example where the fourteen explanatory variables are adopted is described below by way of example, all of the fourteen explanatory variables are not essential. Accuracy required in discriminant analysis can be achieved by adopting at least five explanatory variables above. In other words, accuracy in discriminant analysis can sufficiently be improved by using at least two AC impedance real number components (explanatory variables $x_4$ and $x_5$) plotted in the semicircular portion of the Nyquist plot, at least two AC impedance imaginary number components (explanatory variables $x_8$ and $x_9$) plotted in the semicircular portion, and at least one AC impedance imaginary number component (explanatory variable $x_{10}$) plotted in the linear portion.

Figure 11:
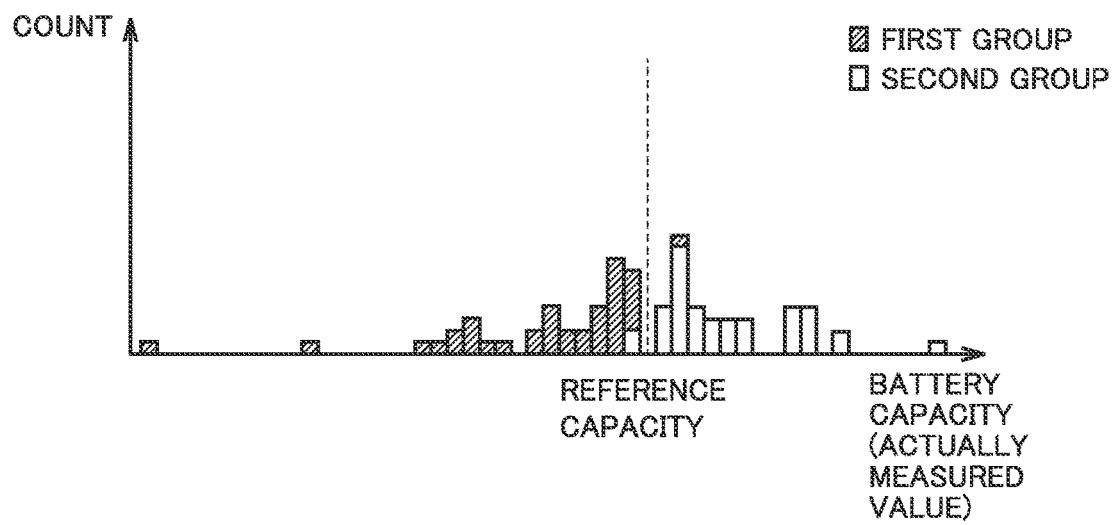
FIG. 11 is a diagram showing a histogram representing a result of evaluation of accuracy in discriminant analysis in the present embodiment.

FIG. 11 is a diagram showing a histogram representing a result of evaluation of accuracy in discriminant analysis in the present embodiment. In FIG. 11, the abscissa represents a battery capacity (an actually measured value) of a module highly accurately measured by charging and discharging of the module. The reference capacity is set to 5.6 Ah in this example. The ordinate represents a count (the number of modules).

FIG. 11 shows, as being hatched, the number (count) of modules determined as belonging to the first group as a result of discriminant analysis described previously, and shows in a white color without hatching, the number (count) of modules determined as belonging to the second group. The number of pieces of sample data is 79 in total. Specifically, there are 39 pieces of sample data of which actually measured value of the battery capacity is equal to or higher than the reference and there are 40 pieces of sample data of which actually measured value of the battery capacity is lower than the reference.

It can be read from FIG. 11 that the battery capacity of most of the modules determined as belonging to the first group is actually lower than the reference capacity and the battery capacity of most of the modules determined as belonging to the second group is actually higher than the reference capacity. Specifically, a ratio of correct discrimination as the module of which actually measured value of the battery capacity is lower than the reference capacity belonging to the first group (which is denoted as a "ratio of correct discrimination $R_{OK}$" below) is 95.0%. A ratio of correct discrimination as the module of which battery capacity is equal to or higher than the reference capacity belonging to the second group (which is denoted as a "ratio of correct discrimination $R_{NG}$" below) is 97.4%. It can thus be concluded that realization of sufficiently highly accurate discriminant analysis is supported according to the present embodiment.

In order to confirm that the result of evaluation shown in FIG. 11 is not derived from overfitting by adopting the fourteen explanatory variables, cross validation as will be described below is conducted.

Figure 12:
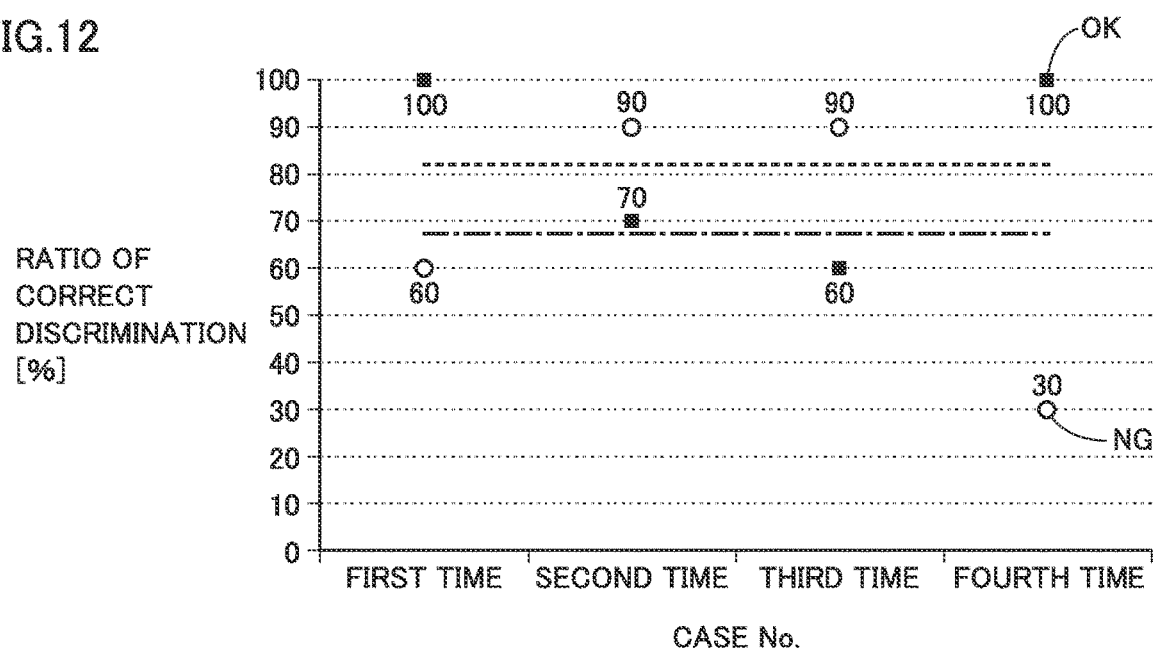
FIG. 12 is a diagram showing a result of cross validation in which sample data is divided into four parts.

FIG. 12 is a diagram showing a result of cross validation in which sample data is divided into four parts. In FIG. 12, the abscissa represents the number of times (first time to fourth time) of cross validation. This is also applicable to FIGS. 13 to 15 which will be described later. The ordinate represents a ratio of correct discrimination ($R_{OK}$ or $R_{NG}$).

As described previously, sample data from 79 modules in total is prepared. In the example shown in FIG. 11, 79 pieces of sample data are divided into four blocks substantially equal to one another in number of pieces of data (approximately 20 pieces). In the first cross validation, discriminant analysis is conducted with one of four blocks being adopted as test data and with three remaining blocks being adopted as training data (learning data). In the second cross validation, discriminant analysis is conducted with another block being adopted as test data and with three remaining blocks being adopted as training data. This is also applicable to third and fourth cross validations. As a result of cross validation four times, an average value (shown with a dashed line) of ratios of correct discrimination $R_{OK}$ shown with a white circle is 83%. An average value (shown with a chain dotted line) of ratios of correct discrimination $R_{NG}$ shown with a solid black square is 68%.

Figure 13:
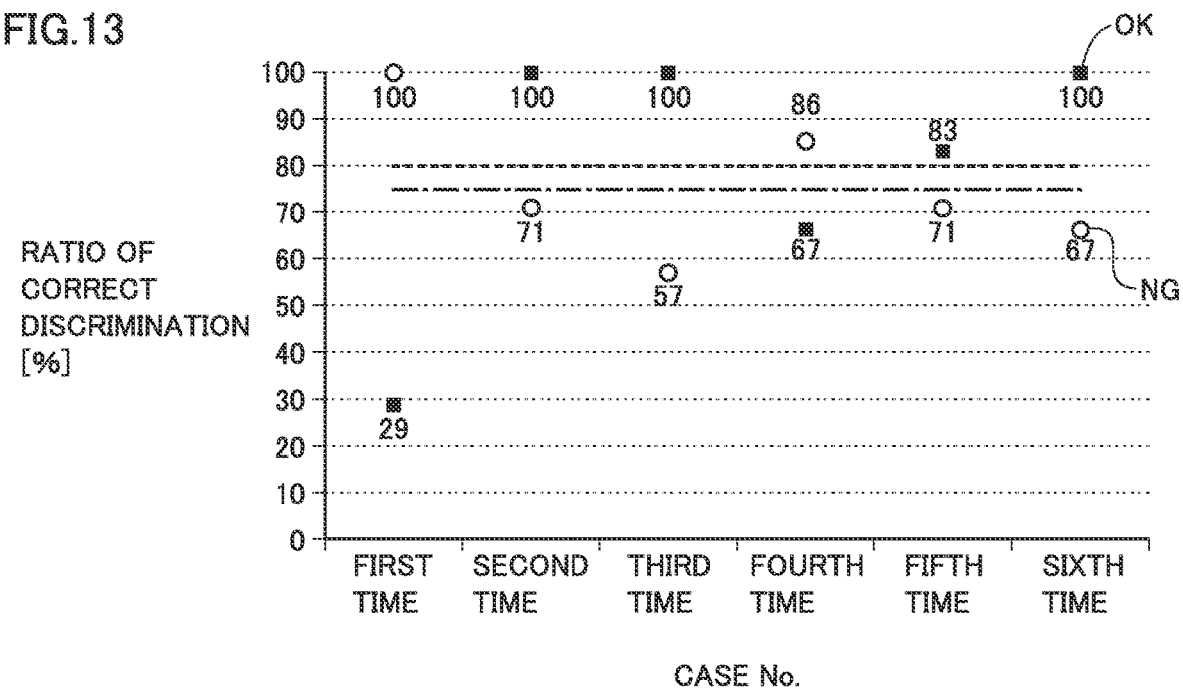
FIG. 13 is a diagram showing a result of cross validation in which sample data is divided into six parts.
Figure 14:
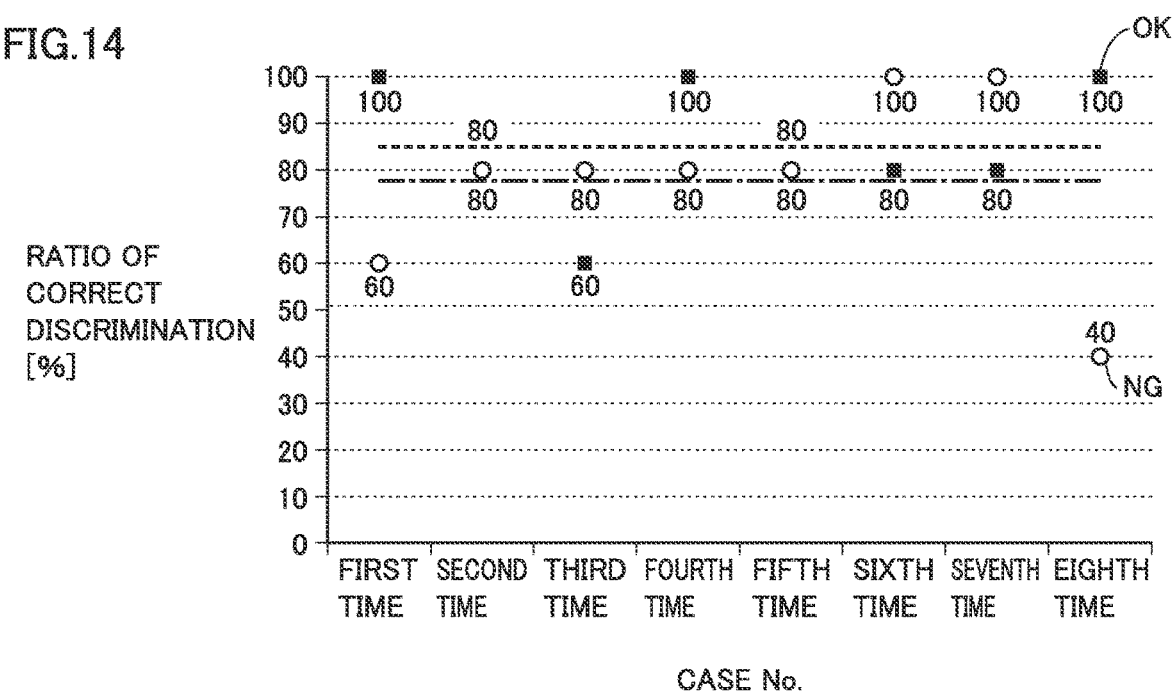
FIG. 14 is a diagram showing a result of cross validation in which sample data is divided into eight parts.
Figure 15:
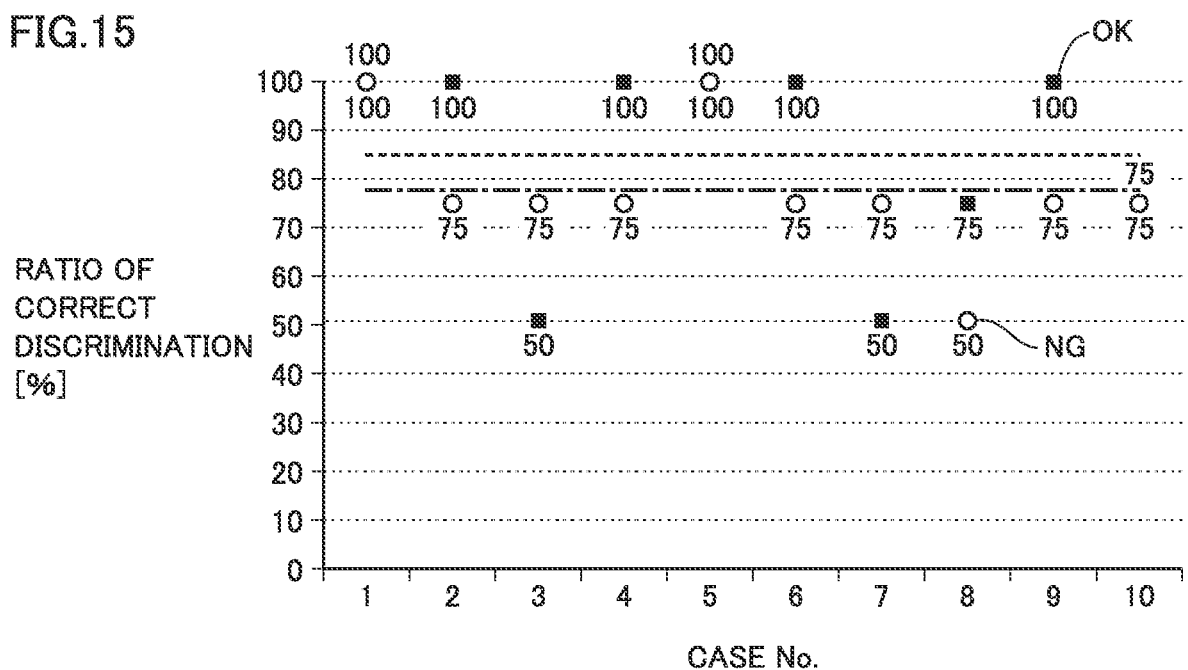
FIG. 15 is a diagram showing a result of cross validation in which sample data is divided into ten parts.

FIG. 13 is a diagram showing a result of cross validation in which sample data is divided into six parts. FIG. 14 is a diagram showing a result of cross validation in which sample data is divided into eight parts. FIG. 15 is a diagram showing a result of cross validation in which sample data is divided into ten parts.

Referring to FIGS. 13 to 15, in the example of division into six parts, an average value of ratios of correct discrimination $R_{OK}$ is 80% and an average value of ratios of correct discrimination $R_{NG}$ is 75%. In the example of division into eight parts, an average value of ratios of correct discrimination $R_{OK}$ is 85% and an average value of ratios of correct discrimination $R_{NG}$ is 78%. In the example of division into ten parts, an average value of ratios of correct discrimination $R_{OK}$ is 85% and an average value of ratios of correct discrimination $R_{NG}$ is 78%. Thus, in any example of division into four parts to division into ten parts, a ratio approximately from 70% to 80% is ensured as ratio of correct discrimination $R_{OK}$ and ratio of correct discrimination $R_{NG}$. Though fourteen explanatory variables apparently seem to be excessive, overfitting does not occur and it can be concluded that generalization performance of discriminant analysis is sufficiently high.

As set forth above, in the present embodiment, at least five explanatory variables and preferably fourteen explanatory variables are used in discriminant analysis by the Maharanobis-Taguchi system. By using these explanatory variables, as shown in FIG. 11, a module of which battery capacity is predicted to be lower than the reference capacity when it is subjected to capacity restoration processing can highly accurately be determined as belonging to the first group, and a module of which battery capacity is predicted to be equal to or higher than the reference capacity when it is subjected to capacity restoration processing can highly accurately be determined as belonging to the second group.

The module determined as belonging to the second group is subjected to capacity restoration processing so that the discharged capacity can be increased and the battery capacity can effectively be restored. A battery assembly can be manufactured from a plurality of modules of which battery capacity has sufficiently been restored. A module determined as belonging to the first group is resource-recycled without being subjected to capacity restoration processing. Thus, ineffective capacity restoration processing can be skipped so that time and cost required for capacity restoration processing can be saved.

Though the embodiment of the present disclosure has been described, it should be understood that the embodiment disclosed herein is illustrative and non-restrictive in every respect. The scope of the present disclosure is defined by the terms of the claims and is intended to include any modifications within the scope and meaning equivalent to the terms of the claims.

What is claimed is:

1. A battery information processing system which processes information on a secondary battery representing a nickel metal hydride battery including a positive electrode, a negative electrode, and a safety valve, the battery information processing system comprising:
   an obtaining device configured to obtain a measurement value of an AC impedance of the secondary battery for creating a Nyquist plot; and
   an analysis device configured to determine, by a Maharanobis-Taguchi method using a plurality of explanatory variables, to which of a first group and a second group the secondary battery will belong when the secondary battery is subjected to capacity restoration processing, the first group being defined as a group of secondary batteries of which battery capacity is lower than a reference capacity, the second group being defined as a group of secondary batteries of which battery capacity is higher than the reference capacity,
   the plurality of explanatory variables including a plurality of feature values extracted from the Nyquist plot,
   the Nyquist plot including a semicircular portion which is a semicircular track of measurement values of the AC impedance and a linear portion which is a linear track of measurement values of the AC impedance,
   the plurality of feature values including
      at least two AC impedance real number components plotted in the semicircular portion,
      at least two AC impedance imaginary number components plotted in the semicircular portion, and
      at least one AC impedance imaginary number component plotted in the linear portion.

2. The battery information processing system according to claim 1, wherein
   the plurality of explanatory variables further include an open circuit voltage of the secondary battery at time of start of measurement of the AC impedance and a temperature of the secondary battery at the time of measurement of the AC impedance, and
   the plurality of feature values further include a slope of the linear portion.

3. The battery information processing system according to claim 1, wherein
   the Nyquist plot includes the measurement value of the AC impedance when a frequency of an AC signal applied to the secondary battery is within a frequency range not lower than 100 mHz and not higher than 1 kHz,
   the at least two AC impedance real number components include a real number component of the measurement value of the AC impedance when the frequency of the AC signal is set to 500 Hz, 63 Hz, 10 Hz, and 3.2 Hz,
   the at least two AC impedance imaginary number components include an imaginary number component of the measurement value of the AC impedance when the frequency of the AC signal is set to 63 Hz, 32 Hz, 10 Hz, and 1.6 Hz, and
   the at least one AC impedance imaginary number component includes an imaginary number component of the measurement value of the AC impedance when the frequency of the AC signal is set to 600 mHz, 200 mHz, and 100 mHz.

4. The battery information processing system according to claim 1, wherein
   the capacity restoration processing refers to processing for increasing a discharged capacity of the negative electrode by generating oxygen gas from the positive electrode by charging the secondary battery and emitting at least some of the generated oxygen gas to outside of the secondary battery through the safety valve.

5. A battery assembly comprising a plurality of the secondary batteries determined as belonging to the second group by the battery information processing system according to claim 1 and subjected to the capacity restoration processing.

6. A battery information processing method of processing information on a secondary battery representing a nickel metal hydride battery including a positive electrode, a negative electrode, and a safety valve, the battery information processing method comprising:
   obtaining a measurement value of an AC impedance of the secondary battery for creating a Nyquist plot; and
   determining, by a Maharanobis-Taguchi method using a plurality of explanatory variables, to which of a first group and a second group the secondary battery will belong when the secondary battery is subjected to capacity restoration processing, the first group being defined as a group of secondary batteries of which battery capacity is lower than a reference capacity, the second group being defined as a group of secondary batteries of which battery capacity is higher than the reference capacity,
   the plurality of explanatory variables including a plurality of feature values extracted from the Nyquist plot,
   the Nyquist plot including a semicircular portion which is a semicircular track of measurement values of the AC impedance and a linear portion which is a linear track of measurement values of the AC impedance,
   the plurality of feature values including at least two AC impedance real number components plotted in the semicircular portion, at least two AC impedance imaginary number components plotted in the semicircular portion, and at least one AC impedance imaginary number component plotted in the linear portion.

7. A method of manufacturing a battery assembly comprising:

collecting a plurality of the secondary batteries determined as belonging to the second group by the battery information processing method according to claim 6 and subjecting each of the secondary batteries to the capacity restoration processing; and constructing a battery assembly from a plurality of the secondary batteries subjected to the capacity restoration processing.

* * * * *